(12) United States Patent
Kobayashi

(10) Patent No.: US 10,983,435 B2
(45) Date of Patent: Apr. 20, 2021

(54) ELECTROPHOTOGRAPHIC PHOTORECEPTOR AND ELECTROPHOTOGRAPHIC DEVICE EQUIPPED WITH THE SAME

(71) Applicant: FUJI ELECTRIC CO., LTD., Kawasaki (JP)

(72) Inventor: Hirotaka Kobayashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/549,018

(22) Filed: Aug. 23, 2019

(65) Prior Publication Data

US 2020/0110335 A1 Apr. 9, 2020

(30) Foreign Application Priority Data

Oct. 9, 2018 (JP) .............................. JP2018-191225

(51) Int. Cl.
*G03G 5/047* (2006.01)
*G03F 7/033* (2006.01)
(Continued)

(52) U.S. Cl.
CPC ................ *G03F 7/033* (2013.01); *C08K 5/17* (2013.01); *C08L 29/00* (2013.01); *G03G 5/0614* (2013.01);
(Continued)

(58) Field of Classification Search
CPC .......... G03G 5/04; G03G 5/06; G03G 5/0612; G03G 5/0614; G03G 5/0764; G03G 15/00; G03G 15/02; G03G 2215/1609
See application file for complete search history.

(56) References Cited

U.S. PATENT DOCUMENTS 5,339,138 A 8/1994 Mishima et al.
2005/0181291 A1 8/2005 Kami et al.
(Continued)

FOREIGN PATENT DOCUMENTS

JP H06-75384 B2 9/1994
JP 2002-174911 A 6/2002
(Continued)

*Primary Examiner* — Peter L Vajda
(74) *Attorney, Agent, or Firm* — Rabin and Berdo, P.C.

(57) ABSTRACT

An electrophotographic device equipped with a negatively-charged laminated electrophotographic photoreceptor that can be charged by a scorotron charging method, and includes a conductive substrate, and a charge generation layer and a charge transport layer sequentially provided on the conductive substrate, wherein the charge generation layer contains a charge generation material and a resin binder that is a poly(vinyl butyral) resin binder, and the charge transport layer contains a charge transport material that is either or both of stilbene compounds represented by Formula (1) and Formula (2), a binder resin, and an oxidation inhibitor that is tribenzylamine represented by Formula 3, wherein the conductive substrate is cylindrical, the electrophotographic photoreceptor has a difference between a maximum value and a minimum value of a surface potential in a circumferential direction, after exposure to ozone at an exposure dose of 100 ppm·h, that is 12 V or less.

4 Claims, 1 Drawing Sheet

(51) Int. Cl.
    *C08L 29/00* (2006.01)
    *C08K 5/17* (2006.01)
    *G03G 5/06* (2006.01)
    *G03G 15/00* (2006.01)

(52) U.S. Cl.
    CPC ... *G03G 5/06145* (2020.05); *C08K 2201/001* (2013.01); *G03G 5/06147* (2020.05); *G03G 15/00* (2013.01)

(56) References Cited

U.S. PATENT DOCUMENTS

2009/0129817 A1* 5/2009 Obata .............. G03G 5/14769
                                                        399/174
2014/0369715 A1   12/2014 Zhang et al.

FOREIGN PATENT DOCUMENTS

| | | |
|---|---|---|
| JP | 2005-195961 A | 7/2005 |
| JP | 2005-215581 A | 8/2005 |
| JP | 2008-276246 A | 11/2008 |
| WO | 2013/157145 A1 | 10/2013 |

* cited by examiner

ELECTROPHOTOGRAPHIC PHOTORECEPTOR AND ELECTROPHOTOGRAPHIC DEVICE EQUIPPED WITH THE SAME

CROSS-REFERENCE TO RELATED APPLICATION(S)

This non-provisional application claims priority from Japanese Patent Application No. 2018-191225 filed on Oct. 9, 2018, the entire contents of which are incorporated herein by reference.

BACKGROUND OF THE INVENTION

1. Field of the Invention

The present invention relates to an electrophotographic photoreceptor (hereinafter, also simply referred to as "photoreceptor") to be used in a printer, a copying machine, or a fax machine based on an electrophotographic method, as well as an improvement of an electrophotographic device equipped with the same.

2. Background of the Related Art

An electrophotographic photoreceptor has a basic structure, in which a photosensitive layer having a photoconductive function is placed on a conductive substrate. An organic electrophotographic photoreceptor using an organic compound as a functional component responsible for generation or transport of electric charge has been recently studied actively and has come to be used more and more in a copying machine, a printer, etc. in view of advantages of a great diversity of materials, high productivity, safety, etc.

Generally, a photoreceptor requires a function of retaining surface electric charge in a dark place, a function of generating electric charge by receiving light, and further a function of transporting the generated electric charge. As a photoreceptor there are a so-called monolayer photoreceptor provided with a single layer photosensitive layer having all of the above functions, and a so-called laminated (functionally separated) photoreceptor provided with a photosensitive layer which stacks layers functionally separated into; a charge generation layer mainly responsible for a function of generating electric charge upon receipt of light; and a charge transport layer responsible for functions of retaining surface electric charge in a dark place and transporting electric charge generated in the charge generation layer upon receipt of light.

Meanwhile, regarding a recent electrophotographic device, so-called digital machines have become mainstream, in which using monochromatic light of argon, helium-neon, or semiconductor laser, a light emitting diode, or the like as an exposure light source, information, such as images and characters, is digitized and converted to light signals, with which an electric-charged photoreceptor is irradiated to form an electrostatic latent image on the surface of the photoreceptor, which is then visualized with a toner.

As a method of charging a photoreceptor, there are a non-contact charging method in which a charging member such as scorotron and the photoreceptor are not brought into contact with each other, and a contact charging system in which a charging member constituted with a semiconductive rubber roller, brush, or the like is brought into contact with the photoreceptor. Among them, in the electrophotographic device using the scorotron charging method, since ozone is prone to be generated by corona discharge, an evacuation mechanism is usually provided for avoiding an increase in ozone concentration, so as to prevent deterioration of the electrical characteristics of the photoreceptor due to accumulation of ozone inside the device.

For example, for the purpose of obtaining a photoreceptor with high sensitivity, low sensitivity degradation, and long life capable of enhancing the abrasion resistance and suppressing an adverse effect of an atmosphere containing ozone over an extended period of service, JP2002-174911A (Patent Document 1 of 1) discloses a laminated electrophotographic photoreceptor, which may be used in an electrophotographic device according to a reversal development system, where the ozone concentration around the photoreceptor is from 5 ppm to 50 ppm, and the abrasion rate of the photosensitive layer is 200 Å or less per 1000 revolutions, and in which at least 2 layers, namely a charge generation layer and a charge transport layer are formed on an electrically conductive support, wherein the charge transport layer contains an oxidation inhibitor, and has a (charge transport material/binder) ratio of 10/14 to 10/20, and a mobility of $1 \times 10^{-6}$ cm$^2$V·sec or more at an electric field strength of 20 V/μm.

A method of enhancing the ozone resistance of a photoreceptor by keeping the ozone concentration at a low level as disclosed in JP2002-174911A has been known. However, in some cases ozone may remain in the device at a high concentration due to a problem related to the device structure or the evacuation function. Consequently, development of an electrophotographic photoreceptor that can avoid an image defect caused by deterioration of the electrical characteristics even in such cases, has been desired.

Therefore, an object of the present invention is to provide an electrophotographic photoreceptor, which is superior in ozone resistance, and capable of suppressing deterioration of image quality even in an atmosphere containing ozone at a higher concentration than before when a scorotron charging method is used, as well as an electrophotographic device equipped with the same.

SUMMARY OF THE INVENTION

The inventor studied diligently to find that the object can be achieved by using a specific resin binder in a charge generation layer of a negatively-charged laminated photoreceptor, and using a specific combination of a charge transport material and an oxidation inhibitor in a charge transport layer, thereby completing the present invention.

That is, a first aspect of the present invention is a negatively-charged laminated electrophotographic photoreceptor that can be charged by a scorotron charging method, including a conductive substrate, and a charge generation layer and a charge transport layer sequentially provided on the conductive substrate, wherein the charge generation layer contains a poly(vinyl butyral) resin as a resin binder, and the charge transport layer contains either or both of the stilbene compounds represented by the following Formulae (1) and (2) as a charge transport material, and tribenzylamine as an oxidation inhibitor:

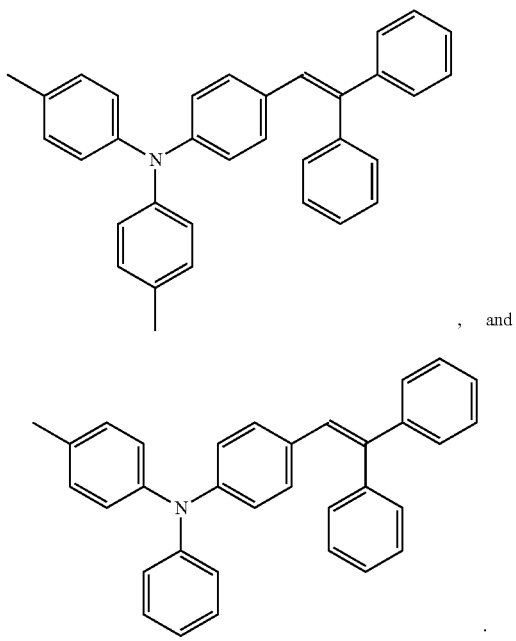

An addition amount of the tribenzylamine in the charge transport layer is favorably 0.1% by mass or more and less than 7% by mass of the addition amount of the charge transport material. Further, when the conductive substrate is cylindrical in the electrophotographic photoreceptor, the electrophotographic photoreceptor has a difference between a maximum value and a minimum value of a surface potential in a circumferential direction, after exposure to ozone at an exposure dose of 100 ppm·h, that is favorably 12 V or less.

An electrophotographic device of a second aspect of the present invention is equipped with the afore-described electrophotographic photoreceptor, and includes a scorotron charging unit.

Effects of the Invention

According to the present invention, an electrophotographic photoreceptor, which is superior in ozone resistance, and capable of suppressing deterioration of image quality even in an atmosphere containing ozone at a higher concentration than before when a scorotron charging method is used, as well as an electrophotographic device equipped with the same have been realized.

DETAILED DESCRIPTION OF THE INVENTION

A specific embodiment of the electrophotographic photoreceptor of the present invention will be described in detail with reference to drawings, provided that the present invention be not restricted in any way by the following description.

Figure 1:
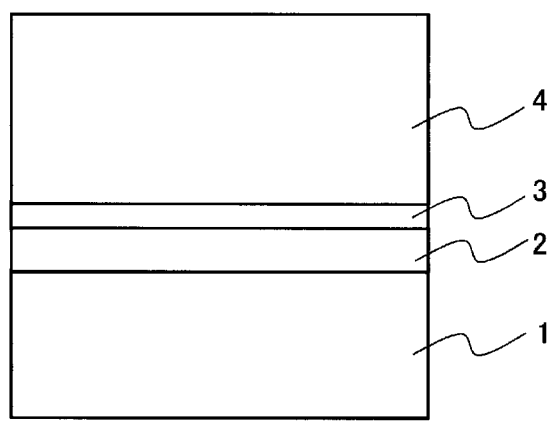
FIG. 1 is a schematic cross-sectional view showing an example of a negatively-charged function separated laminated electrophotographic photoreceptor according to the present invention.

FIG. 1 is a schematic cross-sectional view showing an example of an electrophotographic photoreceptor of the present invention, and shows a negatively-charged laminated electrophotographic photoreceptor. As illustrated, in the case of the negatively-charged laminated photoreceptor, on a conductive substrate 1, an undercoat layer 2, a charge generation layer 3 provided with a charge generating function, and a charge transport layer 4 provided with a charge transporting function are layered in that order. Meanwhile, the undercoat layer 2 may be provided according to need.

The photoreceptor of the embodiment of the present invention can be charged by the scorotron charging method, and in particular used favorably also in an environment inside the electrophotographic device where ozone derived from the scorotron charging unit remains and the ozone concentration is relatively high. Specifically, it is assumed that the same may be used, for example, after long-lasting printing, in an environment where the ozone concentration on the surface of the photoreceptor is 50 ppm or more, and more particularly about 50 to 300 ppm.

In the photoreceptor of the embodiment of the present invention, the charge generation layer 3 contains a poly (vinyl butyral) resin as a resin binder, and the charge transport layer 4 contains either or both of the stilbene compounds represented by the following Formulae (1) and (2) as a charge transport material, and tribenzylamine (TBA) as an oxidation inhibitor:

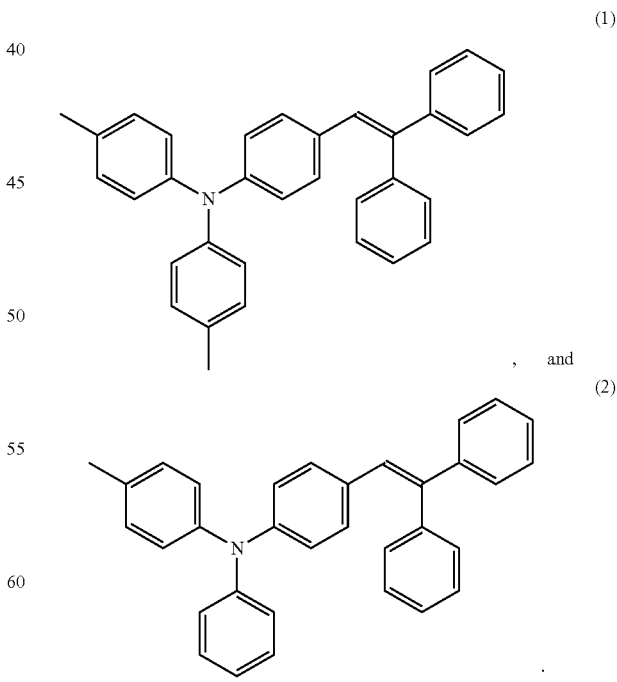

The structural formula of TBA is shown in the following Formula (3):

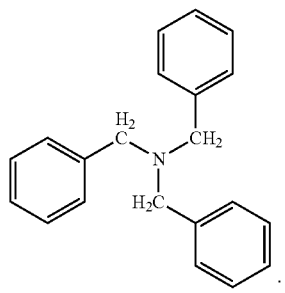

(3)

By using the above materials in combination, it was possible to obtain a photoreceptor in which the deterioration of the electrical characteristics was suppressed and thereby occurrence of an image defect was reduced, even in an environment with a high ozone concentration. For example, when a cylindrical conductive substrate is used, a difference between a maximum value and a minimum value of a surface potential in the circumferential direction after exposure to ozone at an exposure dose of 100 ppm·h can be suppressed to 12 V or less, or even to 10 V or less, so that occurrence of an image defect caused by such a potential difference can be suppressed. Therefore, the photoreceptor of the embodiment of the present invention can be used without occurrence of an image defect even in a device which produces an atmosphere containing high concentration of ozone causing ozone exposure on the photoreceptor at a dose of 100 ppm or more, for example, 100 to 300 ppm·h during continuous printing.

The conductive substrate 1 serves as an electrode of the photoreceptor and also as a support for each layer constituting the photoreceptor, and may be any shape such as a cylindrical shape, a plate shape, a film shape, or the like. As a material for the conductive substrate 1, a metal such as an aluminum alloy, a stainless steel, and nickel, or a glass, a resin or the like, which surface has received a conducting treatment, may be used.

The undercoat layer 2 is constituted with a layer mainly composed of a resin, or a metal oxide film such as alumite. The undercoat layer 2 is provided optionally for the purpose of adjustment of the inflow property of a charge from the conductive substrate 1 to the photosensitive layer, covering defects on the surface of the conductive substrate, enhancing the adhesion between the photosensitive layer and the conductive substrate 1, or the like. Examples of a resin material to be used for the undercoat layer 2 include an insulating polymer such as casein, poly(vinyl alcohol), polyamide, a melamine resin, and cellulose, and a conductive polymer such as polythiophene, polypyrrole, and polyaniline. These resins may be used singly or in combination as appropriate. Further, these resins may be used after adding a metal oxide, such as titanium dioxide and zinc oxide thereto.

The charge generation layer 3 is formed, for example, by a method of applying a coating liquid in which particles of a charge generating material are dispersed in a resin binder, and receives light to generate charges. It is preferable for the charge generation layer 3 to have a high charge generation efficiency and also a favorable inflow property of the generated charges into the charge transport layer 4, and is further desirable for it to have a low electric field dependence and a good inflow property even in a low electric field. Specifically, as the charge generating material, a phthalocyanine compound, such as X-form metal-free phthalocyanine, τ-form metal-free phthalocyanine, α-form titanyl phthalocyanine, Y-form titanyl phthalocyanine, γ-form titanyl phthalocyanine, amorphous titanyl phthalocyanine, hydroxygallium phthalocyanine, chlorogallium phthalocyanine, and ε-form copper phthalocyanine, various azo pigments, an anthanthrone pigment, a thiapyrylium pigment, a perylene pigment, a perinone pigment, a squarylium pigment, a quinacridone pigment, etc. may be used singly or in combination as appropriate, and a suitable material can be selected corresponding to the light wavelength region of the exposure light source used for image formation. In particular, a phthalocyanine compound can be suitably used. The charge generation layer 4 may be mainly composed of a charge generating material, and a charge transport material or the like may be added thereto.

As described above, it is necessary that a poly(vinyl butyral) resin is used as a resin binder for the charge generation layer 3. In this case it may be used in combination with another resin. As such other resin, a polycarbonate resin, a polyester resin, a polyamide resin, a polyurethane resin, a vinyl chloride resin, a vinyl acetate resin, a phenoxy resin, a poly(vinyl acetal) resin, a polystyrene resin, a polysulfone resin, a diallyl phthalate resin, and a polymer or a copolymer of a methacrylate, and the like may be used singly or in an appropriate combination. When a poly(vinyl butyral) resin and another resin are used in combination as the resin binder of the charge generation layer 3, the content of the poly(vinyl butyral) resin in the total amount of the resin binder in the charge generation layer 3 is preferably 60% by mass or more, and more preferably 70% by mass or more.

The content of the charge generating material in the charge generation layer 3 is favorably from 20 to 80% by mass, and more favorably from 30 to 70% by mass, with respect to the solid content in the charge generation layer 3. The content of the resin binder in the charge generation layer 3 is favorably from 20 to 80% by mass, and more favorably from 30 to 70% by mass, with respect to the solid content in the charge generation layer 3. In addition, since the charge generation layer 3 only needs to have a charge generating function, the thickness thereof is generally from 0.01 to 1 μm, and favorably from 0.05 to 0.5 μm.

The charge transport layer 4 is mainly composed of a charge transport material and a resin binder.

As the charge transport material for the charge transport layer 4, it is necessary to contain either or both of the stilbene compounds represented by the general Formulae (1) and (2), however, it may be also used in combination with another compound. As such other compound, various hydrazone compounds, styryl compounds, diamine compounds, butadiene compounds, indole compounds, arylamine compounds, etc. may be used singly or in an appropriate combination. When either or both of the stilbene compounds represented by the general Formulae (1) and (2) are used together with another charge transport material as the charge transport material for the charge transport layer 4, the content of the stilbene compound in the total amount of the charge transport material of the charge transport layer 4 is preferably 60% by mass or more, and more preferably 70% by mass or more.

As a resin binder for the charge transport layer 4, various polycarbonate resins, such as a polyarylate resin, a bisphenol A type, a bisphenol Z type, a bisphenol C type, a bisphenol A-biphenyl copolymer, and a bisphenol Z-biphenyl copolymer, may be used singly or in a mixture of plural kinds thereof. Further, the same kind of resins with a different molecular weight may be used in a mixture. Besides the above, a polyphenylene resin, a polyester resin, a poly(vinyl acetal) resin, a poly(vinyl butyral) resin, a poly(vinyl alcohol) resin, a vinyl chloride resin, a vinyl acetate resin, a polyethylene resin, a polypropylene resin, an acrylic resin, a polyurethane resin, an epoxy resin, a melamine resin, a silicone resin, a polyamide resin, a polystyrene resin, a polyacetal resin, a polysulfone resin, a polymer of a methacrylate, and a copolymer thereof may be used. The mass average molecular weight of the resin binder in terms of polystyrene according to a GPC (gel permeation chromatography) analysis is favorably from 5,000 to 250,000, and more favorably from 10,000 to 200,000.

The content of a charge transport material in the charge transport layer 4 is favorably from 10 to 80% by mass, and more favorably from 20 to 70% by mass, with respect to the solid content of the charge transport layer 4. The content of a resin binder in the charge transport layer 4 is favorably from 20 to 90% by mass, and more favorably from 30 to 80% by mass, with respect to the solid content of the charge transport layer 4. The thickness of the charge transport layer 4 is preferably in a range of 3 to 50 μm, and more preferably in a range of 15 to 40 μm, for the sake of maintaining a practically effective surface potential.

An anti-degradant such as an oxidation inhibitor and a light stabilizer may be added into the charge generation layer 3 and the charge transport layer 4 for the purpose of improvement of environmental resistance or stability against harmful light. Examples of a compound used for such a purpose include a chromanol derivative such as tocopherol and an esterified compound, a polyarylalkane compound, a hydroquinone derivative, an etherified compound, a dietherified compound, a benzophenone derivative, a benzotriazole derivative, a thioether compound, a phenylenediamine derivative, a phosphonic acid ester, a phosphite ester, a phenol compound, a hindered phenol compound, a straight chain amine compound, a cyclic amine compound, and a hindered amine compound.

As described above, the charge transport layer 4 needs to contain the above-mentioned TBA as an oxidation inhibitor, which may be used in combination with another compound. The addition amount of TBA in the charge transport layer 4 may be from 0.1% by mass to 8% by mass, preferably 0.1% by mass or more but less than 7% by mass, and more preferably not more than 4% by mass, with respect to the addition amount of a charge transport material. When TBA and another oxidation inhibitor are used in combination as the oxidation inhibitor in the charge transport layer 4, the proportion of TBA in the total amount of the oxidation inhibitor in the charge transport layer 4 is preferably 60% by mass or more, more preferably 70% by mass or more.

The charge generation layer 3 and the charge transport layer 4 may contain a leveling agent such as silicone oil and fluorinated oil for the purpose of improvement of the levelling property of a formed film or impartation of lubricity. Further, for the purpose of adjustment of film hardness, reduction of friction coefficient, impartation of lubricity, etc., a metal oxide such as silica, titanium oxide, zinc oxide, calcium oxide, alumina, and zirconium oxide; a metal sulfate such as barium sulfate and calcium sulfate; a fine particle of a metal nitride such as silicon nitride and aluminum nitride; a particle of a fluorocarbon resin such as a tetrafluoroethylene resin; or a fluorinated comb graft polymer resin may be added. Further, if necessary, another publicly known additive may be added to the extent that electrophotographic characteristics are not significantly impaired.

The photoreceptor of the embodiment of the present invention may be produced, depending on the configuration thereof, by layering the charge generation layer 3 and the charge transport layer 4 one after another on the conductive substrate 1, via the undercoat layer 2 if necessary, according to a conventional method. Each layer may be formed by applying by a usual method such as a dip coating method each coating liquid and drying the same, in which the respective constituent materials are dispersed or dissolved in an appropriate organic solvent. In this case, there is no particular restriction on the type of a solvent used for preparation of the coating liquid, the coating conditions, the drying conditions, and the like, and they can be appropriately selected according to a conventional method.

The electrophotographic photoreceptor according to the present invention exhibits an intended effect when applied to various machine processes. Specifically, it is able to obtain sufficient effect in a developing process including a contact developing system and a noncontact developing system such as a nonmagnetic one component system, a magnetic one component system and a two-component system.

Figure 2:
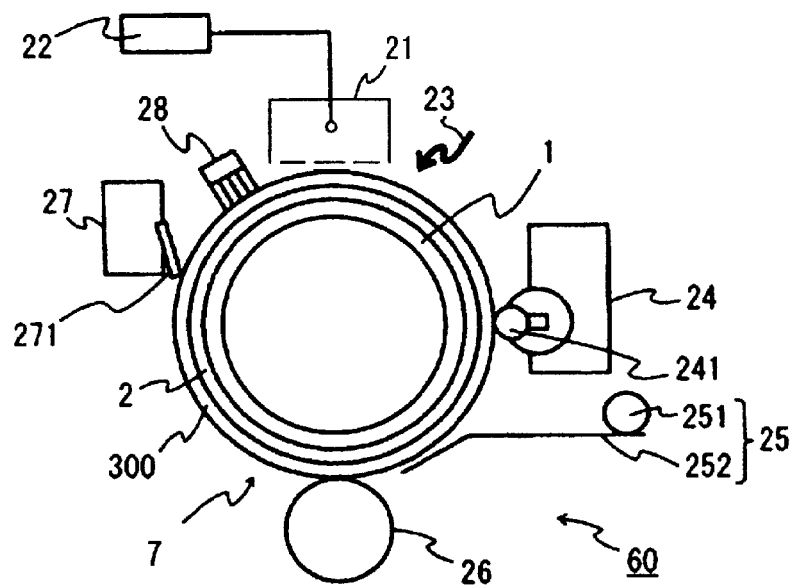
FIG. 2 is a schematic diagram showing an example of an electrophotographic device of the present invention.

Electrophotographic Device:

An electrophotographic device of the embodiment of the present invention is constituted by mounting the electrophotographic photoreceptor, and includes a scorotron charging unit. FIG. 2 shows a schematic diagram of an example of an electrophotographic device according to the present invention. The depicted electrophotographic device 60 according to the present invention is equipped with a photoreceptor 7 according to the present invention including a conductive substrate 1, and an undercoat layer 2 and a photosensitive layer 300 coated on the outer circumference of the conductive substrate 1. The electrophotographic device 60 is constituted with a scorotron charging unit 21 placed on the circumference of the photoreceptor 7; a high-voltage power supply 22 to supply applied voltage to a scorotron charging unit 21; an image exposure member 23; a developer 24 provided with a developing roller 241; a paper feed member 25 provided with a paper feed roller 251 and a paper feed guide 252; and a transfer charging unit (direct charging type) 26. An electrophotographic device 60 may further include a cleaning device 27 provided with a cleaning blade 271 and a destaticizing member 28. The electrophotographic device 60 according to the present invention may be any of a printer, a copying machine, etc., and may be a color machine besides the illustrated monochrome machine, and favorably a color copying machine.

EXAMPLES

A specific embodiment of the present invention will be described in more detail by way of Examples. The scope of the present invention is not restricted in any way by the following Examples, unless it departs from the gist of the invention.

Example 1

A coating liquid for forming an undercoat layer was prepared by dissolving or dispersing 5 parts by mass of an alcohol-soluble nylon (Trade name "CM8000", produced by Toray Industries, Inc.) and 5 parts by mass of titanium oxide fine particles treated with an aminosilane in 90 parts by mass of methanol. The coating liquid for forming an undercoat layer was dip-coated as an undercoat layer on the outer circumference of an aluminum-made cylinder with an outer diameter of 30 mm to be used as a conductive substrate 1, and dried at a temperature of 100° C. for 30 min to complete an undercoat layer 2 with a film thickness of 3 μm.

Next, as a charge generating material 1.5 parts by mass of Y-form titanyl phthalocyanine (Y-TiOPc) and as a resin binder 1 part by mass of a poly(vinyl butyral) resin (Trade name "S-LEC BM-1", produced by Sekisui Chemical Co., Ltd.) were dissolved in 60 parts by mass of dichloromethane to prepare a coating liquid for a charge generation layer. The coating liquid for a charge generation layer was dip-coated on the undercoat layer 2 and dried at a temperature of 80° C. for 30 min to form a charge generation layer 3 having a thickness of 0.3 μm.

A coating liquid for forming a charge transport layer was prepared by dissolving 8 parts by mass of the charge transport material shown in Table 1 below, 12 parts by mass of a resin having the repeating unit represented by the following Formula as a resin binder, and an additive shown in Table 1 below in 80 parts by mass of tetrahydrofuran:

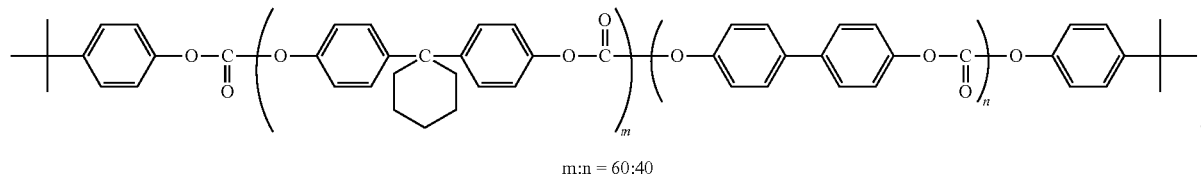

m:n = 60:40

The coating liquid for forming a charge transport layer was dip-coated onto the above charge generation layer 3 and dried at a temperature of 120° C. for 60 min to form a charge transport layer 4 having a thickness of 20 μm to produce a negatively-charged laminated photoreceptor.

The photoreceptors of Examples 2 to 7 and Comparative Examples 1 to 6 were produced in the same manner as in Example 1 except that the conditions with respect to the resin binder used for the charge generation layer, the charge transport material used for the charge transport layer, and the additive used for the charge transport layer were changed to those set forth in Table 1 below.

TABLE 1

| | Charge transport material [*1] | Resin binder for charge generation layer | Additive (% by mass) [*2] | | |
|---|---|---|---|---|---|
| | | | TBA | BHT [*3] | Tocopherol [*4] |
| Comparative Example 1 | Structure A | Poly(vinyl butyral) | 0.7 | — | — |
| Comparative Example 2 | Structure B | Poly(vinyl butyral) | 0.7 | — | — |
| Comparative Example 3 | Structure C1 | Vinyl chloride-vinyl acetate resin | 0.7 | — | — |
| Comparative Example 4 | Structure C1 | Poly(vinyl butyral) | — | — | — |
| Comparative Example 5 | Structure C1 | Poly(vinyl butyral) | — | 0.7 | — |
| Comparative Example 6 | Structure C1 | Poly(vinyl butyral) | — | — | 0.7 |
| Example 1 | Structure C1 | Poly(vinyl butyral) | 0.1 | — | — |
| Example 2 | Structure C1 | Poly(vinyl butyral) | 0.7 | — | — |
| Example 3 | Structure C1 | Poly(vinyl butyral) | 1.5 | — | — |
| Example 4 | Structure C1 | Poly(vinyl butyral) | 4 | — | — |
| Example 5 | Structure C1 | Poly(vinyl butyral) | 4 | — | — |
| Example 6 | Structure C1 | Poly(vinyl butyral) | 8 | — | — |
| Example 7 | Structure C2 | Poly(vinyl butyral) | 4 | — | — |

[*1] A: Stilbene compound represented by the following Formula

TABLE 1-continued

| | Charge transport material [*1] | Resin binder for charge generation layer | Additive (% by mass) [*2] | | |
|---|---|---|---|---|---|
| | | | TBA | BHT [*3] | Tocopherol [*4] |

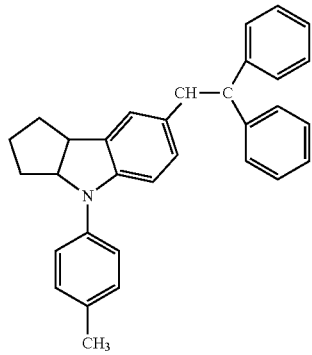 [SMILES: Cc1ccc(N2c3ccc(CC(c4ccccc4)c4ccccc4)cc3C3CCCC32)cc1]

B: Benzidine compound represented by the following Formula

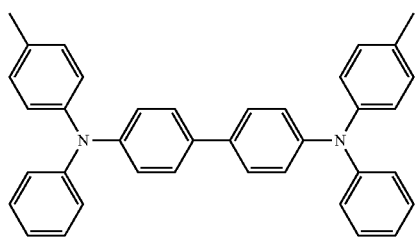 [SMILES: Cc1ccc(N(c2ccccc2)c2ccc(-c3ccc(N(c4ccccc4)c4ccc(C)cc4)cc3)cc2)cc1]

C1: Stilbene compound represented by the above Formula (1)
C2: Stilbene compound represented by the above Formula (2)
[*2] The proportion of the addition amount of the additive with respect to the addition amount of the charge transport material in the charge transport layer.
[*3] BHT: Dibutyl hydroxytoluene (hindered phenol)

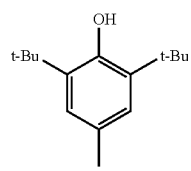

[*4] Tocopherol (hindered phenol)

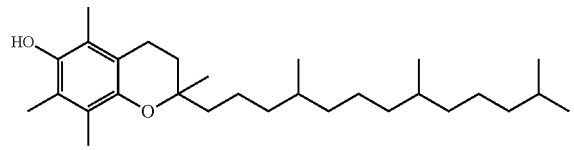

DL-α-Toc

The rating was carried out on the photoreceptors produced in each of Examples and Comparative Examples as below. The results are shown in Table 2 below.

Surface Potential:

The surface potential of the photoreceptor obtained in each Example and Comparative Example was rated by the following method using a CYNTHIA manufactured by GENTEC. The surface of each photoreceptor of the Examples and Comparative Examples was charged to −600 V by corona discharge in a dark place under an environment of a temperature of 23° C. and a humidity of 50%, then irradiated for exposure with exposing light split to 780 nm using filters at the light amount of 0.45 μJ/cm², and thereafter the surface potential of the photoreceptor was measured. The exposure-probe time was set at 110 msec. In a case where the surface potential was 90 (−V) or less, it was rated as good.

Potential Deviation after Ozone Exposure:

The photoreceptor obtained in each Example and Comparative Example was exposed to ozone under the conditions set forth in Table 2 below, and then the difference between the maximum value and the minimum value of the surface potential in the circumferential direction was determined. With respect to the measurement of a surface potential, the surface of each photoreceptor of the Examples and Comparative Examples was charged to −600 V by corona discharge in a dark place under an environment of a temperature of 23° C. and a humidity of 50%, then irradiated for exposure with exposing light split to 780 nm using filters until the surface reached −200 V, and thereafter the difference between the maximum value and the minimum value in the circumferential direction of the photoreceptor was determined as the potential deviation. The exposure-probe time was set at 110 msec. In a case where the potential deviation was 12 V or less under the condition that the exposure dose was 100 ppm·h or more, the ozone resistance was superior, and it was rated as good.

Rating:

In a case where the potential deviation exceeded 12 V, the ozone resistance was not sufficient, and therefore it was rated poor (x). In a case where the potential deviation was 12 V or less, and the ozone resistance was sufficient, when the surface potential was 90 (−V) or less it was rated as good (◯), and when the surface potential exceeded 90 (−V) it was rated as fair (Δ).

TABLE 2

| | Potential (before ozone exposure)(−V) | Ozone exposure condition | | | Potential deviation (after exposure) (V) | Rating |
| --- | --- | --- | --- | --- | --- | --- |
| | | Ozone (ppm) | Exposure time (h) | Ozone exposure dose (ppm · h) | | |
| Comparative Example 1 | 65 | 60 | 2 | 120 | 25 | x |
| Comparative Example 2 | 67 | 60 | 2 | 120 | 20 | x |
| Comparative Example 3 | 60 | 60 | 2 | 120 | 20 | x |
| Comparative Example 4 | 60 | 60 | 2 | 120 | 22 | x |
| Comparative Example 5 | 80 | 60 | 2 | 120 | 14 | x |
| Comparative Example 6 | 86 | 60 | 2 | 120 | 18 | x |
| Example 1 | 65 | 60 | 2 | 120 | 10 | ◯ |
| Example 2 | 70 | 60 | 2 | 120 | 8 | ◯ |
| Example 3 | 78 | 100 | 2 | 200 | 8 | ◯ |
| Example 4 | 85 | 100 | 2 | 200 | 8 | ◯ |
| Example 5 | 85 | 100 | 3 | 300 | 10 | ◯ |
| Example 6 | 93 | 60 | 2 | 120 | 10 | Δ |
| Example 7 | 85 | 100 | 3 | 300 | 8 | ◯ |

From the results in Table 2 it has been confirmed that an electrophotographic photoreceptor, which is superior in ozone resistance, and capable of suppressing deterioration of image quality even in an atmosphere containing ozone at a high concentration, can be obtained by using a specific resin binder for a charge generation layer, and using a specific combination of a charge transport material and an oxidation inhibitor for a charge transport layer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A negatively-charged laminated electrophotographic photoreceptor that can be charged by a scorotron charging method, comprising:
    a conductive substrate; and
    a charge generation layer and a charge transport layer sequentially provided on the conductive substrate,
    wherein the charge generation layer contains a charge generation material and a binder resin that is a poly (vinyl butyral) resin, and wherein the charge transport layer contains a charge transport material that is either or both stilbene compounds represented by Formula (1) and Formula (2) below, a binder resin, and an oxidation inhibitor that is tribenzylamine represented by Formula (3) below:

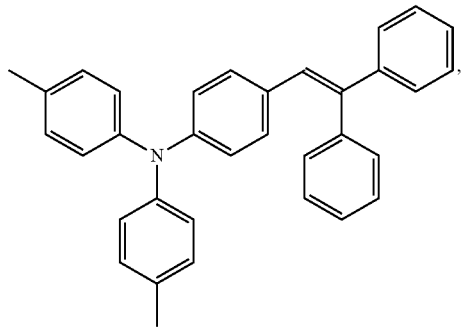

(1)

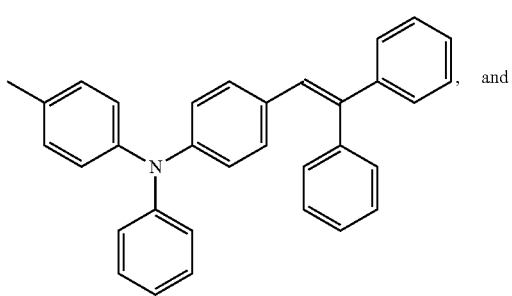

, and (2)

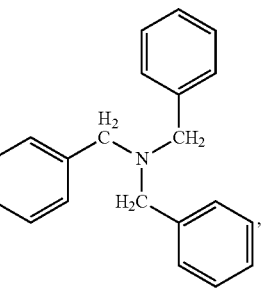

(3)

wherein the conductive substrate is cylindrical, the electrophotographic photoreceptor has a difference between a maximum value and a minimum value of a surface potential in a circumferential direction, after exposure to ozone at an exposure dose of 100 ppm·h, that is 12 V or less.

2. The electrophotographic photoreceptor according to claim 1, wherein the tribenzylamine in the charge transport layer is present in an addition amount of 0.1% by mass or more and less than 7% by mass of an addition amount of the charge transport material.

3. An electrophotographic device that is equipped with the electrophotographic photoreceptor according to claim 1, and that includes a scorotron charging unit.

4. An electrophotographic device that is equipped with the electrophotographic photoreceptor according to claim 2, and that includes a scorotron charging unit.

* * * * *